US006782748B2

(12) United States Patent
Weber et al.

(10) Patent No.: US 6,782,748 B2
(45) Date of Patent: Aug. 31, 2004

(54) HIGH-G ACCELERATION PROTECTION BY CAGING

(75) Inventors: Mark W. Weber, Zimmerman, MN (US); William A. Harris, Coon Rapids, MN (US); Max C. Glenn, Chanhassen, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/292,785

(22) Filed: Nov. 12, 2002

(65) Prior Publication Data

US 2004/0089069 A1 May 13, 2004

(51) Int. Cl.[7] .......................... G01P 15/10; G01P 15/00
(52) U.S. Cl. ................... 73/514.29; 73/514.18
(58) Field of Search .................. 73/514.29, 514.18, 73/514.16, 504.04, 504.12, 504.14, 514.32, 514.17, 514.24

(56) References Cited

U.S. PATENT DOCUMENTS

| | | | |
|---|---|---|---|
| 5,177,331 A | * | 1/1993 | Rich et al. ............ 200/61.45 R |
| 5,203,208 A | | 4/1993 | Bernstein |
| 5,205,171 A | * | 4/1993 | O'Brien et al. .......... 73/514.18 |
| 5,734,105 A | | 3/1998 | Mizukoshi |
| 5,821,596 A | | 10/1998 | Miu et al. |
| 5,992,233 A | | 11/1999 | Clark |
| 6,060,336 A | | 5/2000 | Wan |
| 6,067,858 A | | 5/2000 | Clark et al. |
| 6,070,463 A | | 6/2000 | Moriya et al. |
| 6,122,961 A | | 9/2000 | Geen et al. |
| 6,426,538 B1 | | 7/2002 | Knowles |
| 6,448,624 B1 | | 9/2002 | Ishio et al. |
| 2002/0093067 A1 | | 7/2002 | Knowles |
| 2003/0160540 A1 | * | 8/2003 | Miller et al. ............... 310/309 |

FOREIGN PATENT DOCUMENTS

| | | |
|---|---|---|
| DE | 41 29 218 | 3/1993 |
| EP | 0 526 923 | 2/1993 |
| WO | WO 95/34798 | 12/1995 |

OTHER PUBLICATIONS

International Search Report for PCT/US03/36251, Date of mailing Apr. 29, 2004.

* cited by examiner

Primary Examiner—Helen Kwok
(74) Attorney, Agent, or Firm—McDonnell Boehnen Hulbert & Berghoff LLP

(57) ABSTRACT

For use in a MEMS device having a suspended proof mass, a method and apparatus for securing the MEMS device during a period of high acceleration. The method may include applying a DC voltage between the proof mass and a non-suspended structure of the device. The non-suspended structure may be mounted on a substrate, and the substrate or the non-suspended structure may be electrically isolated from the proof mass by an insulating layer or by one or more islands. Applying the DC voltage creates an electrostatic force that moves the proof mass toward (or holds the proof mass near) the substrate. Movement of the proof mass may be limited by mechanical contact between the proof mass and the insulating layer, the one or more islands, or by a cage mounted on the substrate during the period of high acceleration.

21 Claims, 3 Drawing Sheets

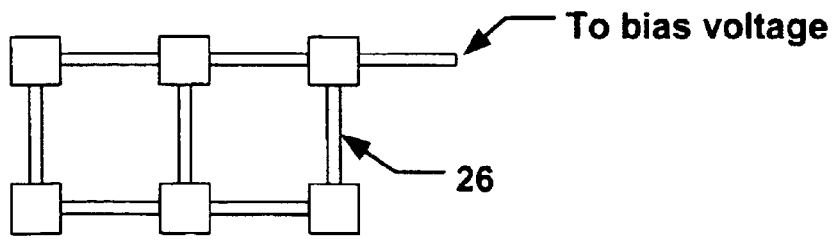
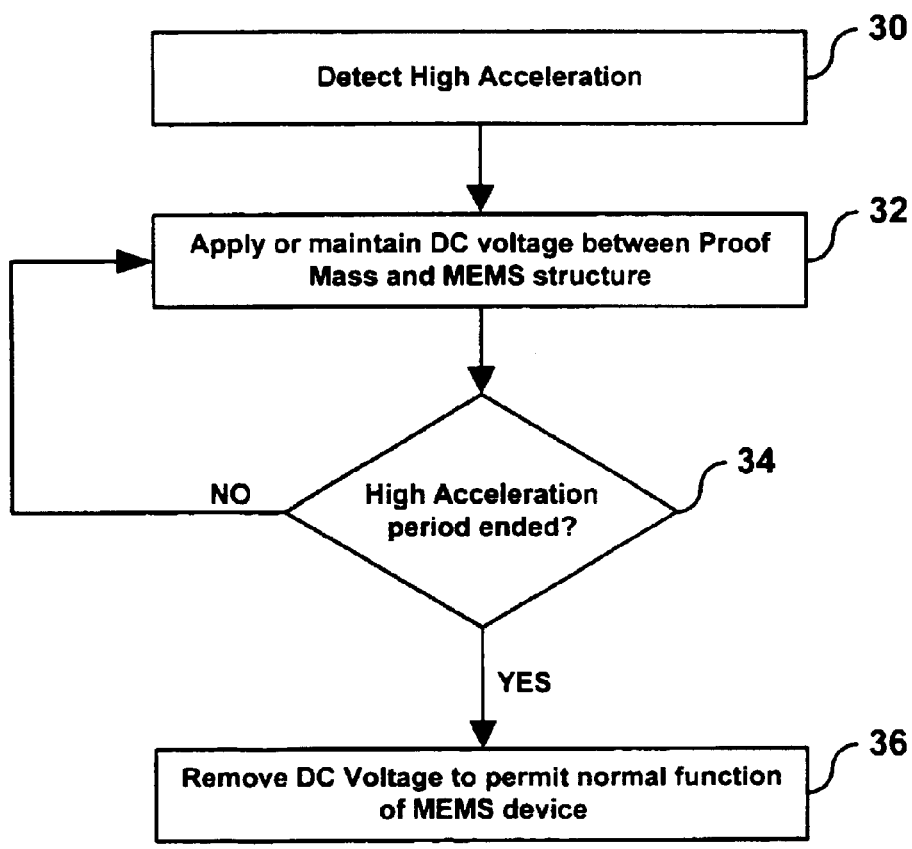
Fig. 3
Fig. 4

HIGH-G ACCELERATION PROTECTION BY CAGING

BACKGROUND

1. Field of the Invention

The present invention relates to micromachined devices and, more particularly, to acceleration protection for micromachined devices.

2. Description of Related Art

Precision-guided or "smart" projectiles have become the weapons of choice in modern warfare due to their high accuracy and the reduction in casualties of both friendly forces and civilians that may be achieved through their use. Currently, highly precise guided munitions that have been tested and proven ready for combat include missiles, such as the U.S. Navy's Tomahawk Land-Attack Missile (TLAM) and the U.S. Air Force's Conventional Air-Launched Cruise Missile (CALCM), and laser, GPS, or infrared guided smart bombs. However, due to their high cost (about $1 million for each TLAM and about $2 million for each CALCM), and due to the complex systems (e.g., aircraft, aircraft carriers, submarines, etc.) required to deliver missiles and smart bombs, the use of precision-guided munitions is not always practical for all military targets. For example, there are situations where the use of short time-of-flight, close-range, high fire-rate, and relatively inexpensive artillery projectiles would be preferred over the use of a single TLAM, CALCM, or smart bomb.

Recent testing has shown that the precision guidance of spinning, gun-fired projectiles is possible: the Office of Naval Research's "Competent Munitions-Advanced Technology Demonstration . . . resulted in the successful test firing of a 5" projectile with a GPS/MEMS INS (Global Positioning System/MicroElectroMechanical System Inertial Navigation System) installed in the fuse section. The GPS/MEMS INS was used to steer the projectile toward a target using a set of movable, nose-mounted fins.

MEMS devices may be manufactured on a large scale using photolithographic techniques to etch silicon wafers, in much the same way that traditional microelectronic integrated circuits are produced in the electronics industry. In silicon-based MEMS devices fabricated using conventional integrated circuit techniques, three-dimensional structures can be integrated with electronic circuitry on the same chip, offering great potential for improvements of sensors, actuators, and other devices. Initially, MEMS devices were strictly silicon-based, like microelectronic devices, but today the term represents complete miniature devices that may or may not be silicon-based, and that can be produced using methods other than photolithographic techniques.

MEMS devices and sensors that may be used in guidance systems can include gyroscopes and accelerometers. Gyroscopes, accelerometers, and other devices may have one or more proof masses that may be suspended above a substrate by spring elements mounted to the substrate. The proof mass is generally made to oscillate at a precise frequency axially and parallel to the substrate by an electronic drive mechanism. As used herein, the term "proof mass" is defined broadly to include any mass suitable for use in a MEMS system. Proof masses typically also include electrical sense elements interleaved with complementary elements on or attached to a sense plate.

MEMS gyroscopes and accelerometers meet at least one criterion for use in gun-launched projectiles: they are extremely small compared to conventional instruments (the system used in the Competent Munitions Demonstration occupied a volume of 13 cubic inches). Because they do have moving parts, however, MEMS devices are still susceptible to failure due to extreme vibration and acceleration. Proof mass suspension elements, drive elements, and sense elements in gun-launched projectiles could easily be damaged due to forces that greatly exceed those forces a sensor is designed to measure; MEMS sensors that are used to guide gun-fired projectiles must withstand more than 10,000 Gs of launch acceleration, as well as vibrations in virtually all directions that are encountered when projectiles spin, "chatter" or ballot in the gun barrel, and when they leave the gun barrel.

Thus, preventing damage to the moving parts of MEMS sensors and other devices while still allowing normal operation is essential.

SUMMARY OF THE INVENTION

In a first principal aspect, a method and apparatus for preventing damage to a MEMS device during a period of high acceleration is disclosed. The MEMS device may have a proof mass mounted to a substrate using spring elements. The proof mass may have a normal range of motion. The method includes applying a DC voltage between the proof mass and a non-suspended structure of the device, such as a sense plate mounted on the substrate. The applied DC voltage is sufficient to create an electrostatic force that moves the proof mass to a position outside the normal range of motion.

In a second principal aspect, a micromachined device that includes a proof mass flexibly suspended above a substrate is disclosed. The proof mass has a normal operating range of motion toward and away from the substrate. The device can also include one or more non-suspended structures mounted on the substrate, and an insulating layer positioned between the proof mass and the substrate. The insulating layer prevents electrical contact between the proof mass and the at least one non-suspended structure when a DC voltage is applied between the proof mass and the non-suspended structure. The DC voltage causes the proof mass to move toward the substrate beyond the normal operating range of motion; the insulating layer limits the motion and prevents electrical contact between the proof mass and the non-suspended structure.

These as well as other aspects and advantages of the present invention will become apparent to those of ordinary skill in the art by reading the following detailed description, with appropriate reference to the accompanying drawings.

BRIEF DESCRIPTION OF THE DRAWINGS

Exemplary embodiments of the present invention are described herein with reference to the drawings, in which:

FIG. 3 is a plan view of several insulating islands or structures of the exemplary embodiment; and FIG. 4 is a flow chart that illustrates the operation of the exemplary embodiment.

DETAILED DESCRIPTION OF AN EXEMPLARY EMBODIMENT

MEMS sensors that are used to guide gun-fired projectiles must withstand more than 10,000 Gs of launch acceleration, as well as vibrations in virtually all directions that occur when projectiles are fired from a gun. Such forces could easily damage the moving parts, such as suspended proof masses and springs, of MEMS sensors, but somehow securing the proof mass of a MEMS sensor in relation to a sense plate, substrate, or overall package during periods of high acceleration would enable the sensor to survive high acceleration and vibration. Unfortunately, the proof mass must move freely in order to operate properly when the sensor is no longer under high acceleration. Accordingly, exemplary and alternative exemplary embodiments of the present invention secure the proof mass during periods of high acceleration but still allow it to move freely after the high acceleration is over.

Securing the proof mass while still allowing freedom of motion after firing may be accomplished by applying a DC voltage between the proof mass and the sense plate or other non-suspended structure of the device. The DC voltage creates an electrostatic force that causes the proof mass to "snap down" into mechanical contact with a portion of the MEMS device that is positioned between the proof mass and the substrate. In an alternative embodiment, the device may also include a cage or well into which the proof mass is drawn by the electrostatic force. The cage limits the motion of the proof mass in one or more directions parallel to the substrate, greatly increasing the device's resistance to acceleration over the resistance provided by friction alone.

Figure 1:
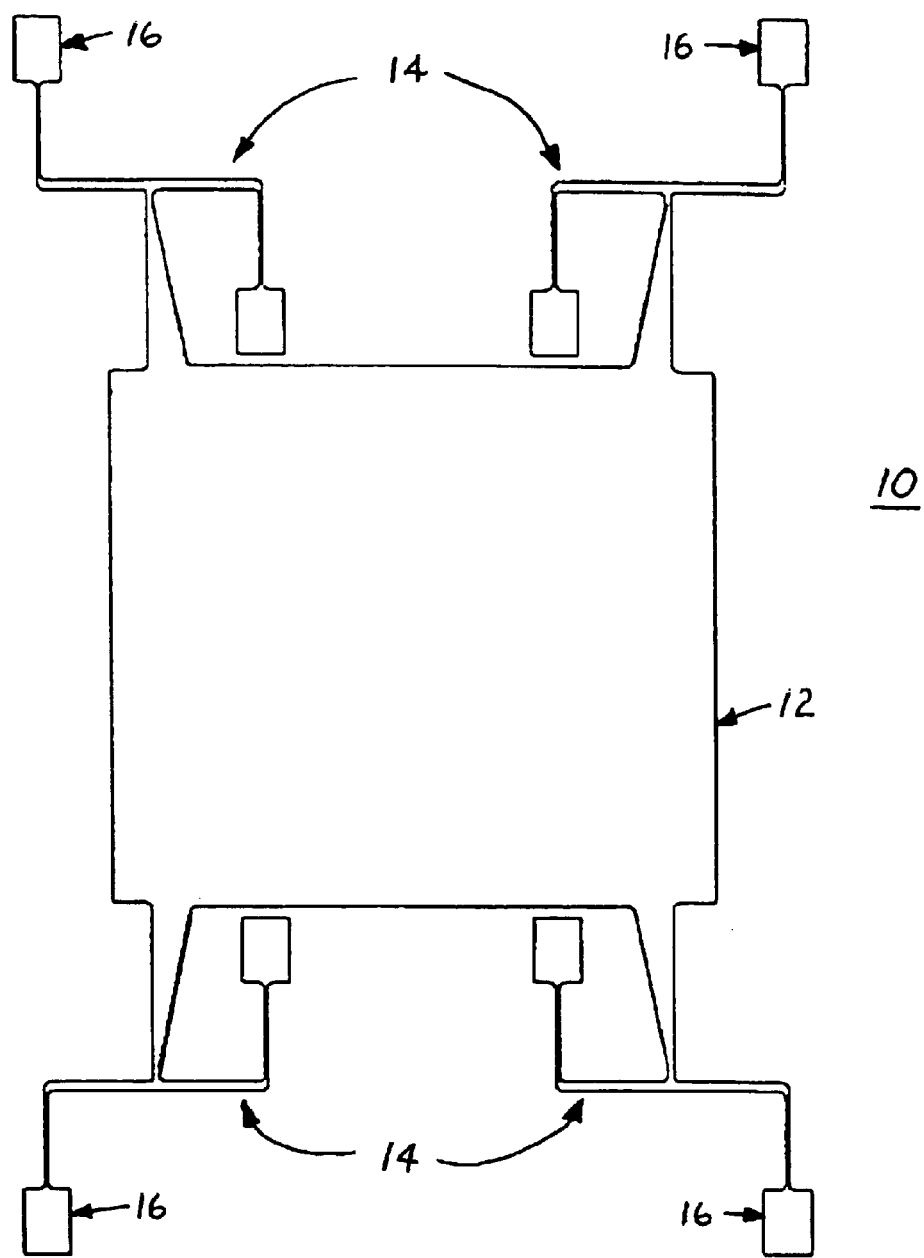
FIG. 1 is a plan view of a suspended proof mass in accordance with an exemplary embodiment, with drive and sense elements omitted for clarity.

Referring to the drawings, FIG. 1 is a plan view of a suspended proof mass of a MEMS gyroscope in accordance with the exemplary embodiment, with drive and sense elements omitted for clarity. A more detailed description of the MEMS gyroscope of FIG. 1 may be found in the commonly owned U.S. application Ser. No. 09/761,291 entitled "Suspended Micromachined Structure" filed on Jan. 16, 2001, naming Gary R. Knowles as inventor. The entirety of application Ser. No. 09/761,291 is hereby incorporated by reference.

Although a proof mass for a gyroscope is shown, the invention is suitable for other MEMS sensors, such as accelerometers, as well. Micromachined proof mass 12 may be suspended above substrate 10 by a plurality of support arms 14 attached to substrate 10 at locations 16. The support arms are dimensioned to be flexible relative to proof mass 12; thus, support arms 14 flexibly couple proof mass 12 to substrate 10 so that there is a very small distance separating the proof mass and the substrate. Proof mass 12 and support arms 14 may be integrally formed using any suitable micromachining technique. Terms such as "affixed", "attached", and the like are broadly defined herein to describe positional relationships between elements of micromachined structures; it should be understood that various elements of MEMS devices can be formed integrally using micromachining techniques.

In the exemplary embodiment, a MEMS gyroscope or sensor in accordance with the present invention may be fabricated from a single, unitary silicon substrate, but this is neither a requirement nor a limitation of the invention as it is contemplated; a MEMS device may be fabricated from various materials known to be suitable for micromachining, such as silicon, polycrystalline silicon, and other crystalline or amorphous materials. Also, although only one proof mass is shown, the invention is equally applicable to MEMS gyros having two or more proof masses that oscillate in opposition to each other for the purpose of canceling undesirable vibrations in the substrate and providing greater sensitivity, since the displacement of each proof mass may be measured by the system.

During operation, proof mass 12 oscillates generally from left to right (as shown in FIG. 1) due to electrical drive elements (not shown), and moves toward or away from substrate 10 due to the forces to which the gyroscope is subjected. Due to the geometry of support arms 14, proof mass 12 can move relatively freely from left to right as viewed from the top in FIG. 1, and to a lesser extent, toward and away from substrate 10. Some freedom to move in either direction perpendicular to substrate 10 is necessary, since such out-of-plane motion results from the torques and accelerations that are ultimately measured by the MEMS gyro.

Figure 2A:
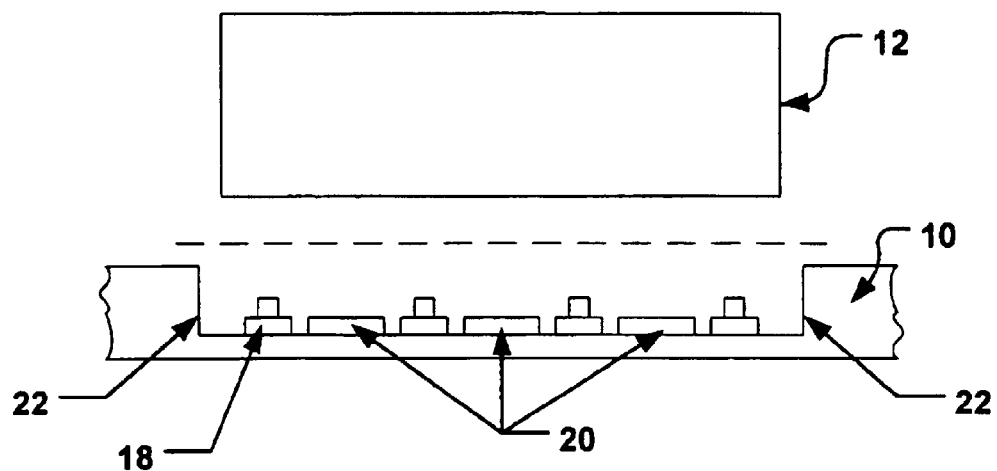
FIG. 2 is a cross-sectional view of the proof mass relative to a substrate.
Figure 2B:
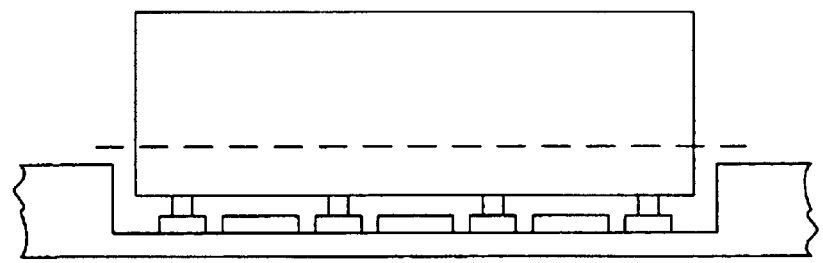

FIG. 2A is a cross-sectional view (not to scale) of a portion of proof mass 12 suspended above the substrate in an undisplaced position, with the support arms as well as the drive and some sense elements omitted for clarity. FIG. 2B is a similar cross-sectional view (not to scale) that shows proof mass 12 in a displaced (i.e., snapped-down) position. Islands 18 may be positioned between the substrate and the proof mass. Also shown is sense plate 20, which is used to measure the displacement of proof mass 12. For clarity of illustration only, the suspension and drive elements are not illustrated in FIGS. 2A and 2B. In the exemplary embodiment, a "cage" or "well", defined by sidewalls 22, may be micromachined into substrate 10. Although a cage can improve the sensor's capability to withstand extreme forces, it is not necessarily critical to all embodiments of the invention, since the friction that results from snapping the proof mass down may be sufficient to protect the sensor.

The dotted lines in FIG. 2A illustrate the normal operating range of out-of-plane motion (i.e., motion toward or away from the substrate) of the proof mass. In other words, the dotted lines represent the maximum expected out-of-plane displacement that results from the forces the MEMS device was designed to measure.

Prior to being fired from a gun, a DC voltage can be applied between proof mass 12 and sense plate 20. This voltage may be applied immediately prior to firing, or it may be applied further in advance of firing, if a long-life battery is used. Applying a DC voltage across the relatively small gap between the proof mass and the sense plate generates an attractive electrostatic force. As this force increases, the gap gets smaller because the proof mass is free to move toward the sense plate. As the gap gets smaller, the force increases further, until proof mass 12 cannot move any closer to sense plate 20. The initial electrostatic force alone may be adequate to start closing the gap and eventually cause the proof mass to snap down, or the acceleration at the time of firing may provide additional force that, in conjunction with the electrostatic force, causes snap down. When proof mass 12 is snapped down, it is displaced beyond its normal range of motion, as shown in FIG. 2B.

Due to the applied DC voltage (about 5 volts), electrical contact between proof mass 12 and sense plate 20 may result in a current that could weld the proof mass to the sense plate, rendering the sensor inoperative. As shown, however, a number of insulated islands 18 limit the proof mass' travel and prevent it from contacting the sense plate. In the exemplary embodiment, the interior of the MEMS package may be at a vacuum, further decreasing the likelihood of current flow between sense plate 20 and proof mass 12. Although islands 18 are illustrated as formed integrally with or attached to substrate 10, this arrangement is only one possible embodiment. For example, spacers attached to or formed integrally with proof mass 12 or extending beyond sidewalls 22 into the well could also prevent electrical contact between proof mass 12 and sense plate 20.

Once the proof mass has reached its maximum travel toward substrate 10, the electrostatic force is sufficient to hold it there despite spring force exerted by support arms 14. The friction that results from the contact between proof mass 12 and islands 18 can limit any motion of proof mass 12 during high acceleration, thus preventing damage to the proof mass or any non-suspended structures (some of which are not shown) of the sensor with which proof mass 12 could collide. The cage defined by sidewalls 22 can decrease the likelihood of damage further by limiting unwanted motion of proof mass 12 in one or more directions parallel to substrate 10 when proof mass 12 is held in place by the electrostatic force.

Figure 2C:
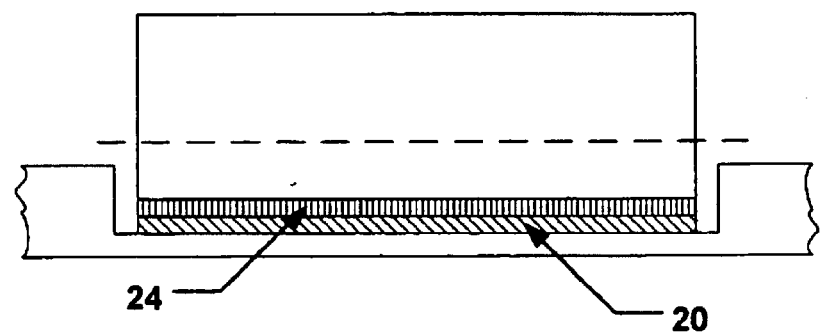

FIG. 2C illustrates another alternative embodiment, where sense plate 20 is electrically isolated from proof mass 12 during snap down by an insulating or semi-insulating layer 24 positioned between the sense plate and the proof mass. The insulating layer 24 may be affixed to sense plate 20 or, alternatively, substrate 10, or it may be affixed to proof mass 12.

Islands 18 in the exemplary embodiment are electrically isolated from sense plate 20, and may be (but are not necessarily) conductively coupled to each other by conductive traces 26, as shown in FIG. 3. During snap down, islands 18 may be held at ground potential or at a potential that is between the voltage of the sense plate and the voltage of the proof mass. Alternatively, they may be held at ground or mid potential at all times, simplifying operation.

FIG. 4 illustrates a number of functions that may be involved in the exemplary embodiment of the invention. As shown at step 30, high acceleration can be detected in order to initiate snap-down of proof mass 12. High acceleration may be detected by an inertial arming mechanism that is contained within the MEMS device (not shown) or that is external. Step 30 may be eliminated if a long-life battery is used and the DC voltage is applied continuously until high acceleration ends. As yet another alternative, the DC voltage may first be applied due to a manual arming procedure.

As shown at step 32, a DC voltage may be applied between the suspended proof mass and some non-suspended structure of the MEMS device, such as a sense plate. As discussed above, the applied DC voltage will be sufficient to either pull the proof mass into contact with some non-suspended structure beyond the normal operating range of the proof mass, or it will at least be sufficient to hold the proof mass sufficiently close to some non-suspended structure in order to prevent damage during a high acceleration period associated with firing a projectile, or associated with any other acceleration or vibration. It is not necessarily critical to all embodiments of the invention that the proof mass be held absolutely motionless against some structure of the MEMS device; the advantages of the invention will be realized simply by significantly limiting the motion of the proof mass. In other words, there may be some "bounce" of the proof mass even during snap down.

As shown at step 34, on-chip or external apparatus can sense or approximate whether the period of high acceleration has ended. Such an apparatus may sense acceleration or may simply measure time that elapses from firing a projectile. For example, the voltage could be removed a fixed time after an inertial arming switch senses that the projectile has been fired.

If the high acceleration has not ended, the DC voltage will be maintained, again as shown at step 32, but if the period has ended, the DC voltage will be removed as shown at step 36, allowing the MEMS device to operate normally. By referring to these steps, one of ordinary skill in the art can readily design circuitry or prepare program instructions to carry out the functions required to implement the invention.

Exemplary embodiments of the present invention have been illustrated and described. It will be understood, however, that changes and modifications may be made to the invention without deviating from the spirit and scope of the invention, as defined by the following claims.

I claim:

1. For use in a MEMS device having a proof mass flexibly coupled to a substrate, the proof mass having a normal operating range of motion, a method for securing the MEMS device during a period of high acceleration, the method comprising applying a DC voltage between the proof mass and a non-suspended structure of the device, the DC voltage being sufficient to create an electrostatic force that maintains the proof mass in a displaced position that is outside the normal operating range of motion of the proof mass.

2. The method of claim 1, further comprising:
   making a determination that the period of high acceleration no longer exists; and
   in response to the determination, reducing the DC voltage to a level that is insufficient to hold the proof mass in the displaced position.

3. The method of claim 1, wherein the DC voltage is sufficient to create an electrostatic force that moves the proof mass to the displaced position.

4. The method of claim 1, wherein the DC voltage is applied in response to detecting high acceleration.

5. The method of claim 2, wherein making the determination comprises sensing a decrease in acceleration.

6. The method of claim 2, wherein making the determination comprises measuring passage of a period of time after the high acceleration is detected.

7. A micromachined device comprising:
   a proof mass flexibly coupled to a substrate, the proof mass having a normal operating range of motion;
   at least one non-suspended structure mounted on the substrate; and
   an insulating member positioned between the proof mass and the substrate, the insulating member preventing electrical contact between the proof mass and the at least one non-suspended structure;
   wherein a DC voltage applied between the proof mass and the at least one non-suspended structure causes the proof mass to move toward the non-suspended structure beyond the normal operating range of motion, the insulating member limiting the motion and preventing electrical contact between the proof mass and the at least one non-suspended structure.

8. The micromachined device of claim 7, wherein the insulating member comprises at least one island.

9. The micromachined device of claim 8, wherein the at least one island comprises a plurality of electrically interconnected islands.

10. The micromachined device of claim 8, wherein the at least one island is mounted on the substrate.

11. The micromachined device of claim 8, wherein the at least one island is mounted on the at least one non-suspended structure.

12. The micromachined device of claim 8, wherein the non-suspended structure comprises a sense plate.

13. The micromachined device of claim 8, further comprising:
   a cage in a fixed positional relationship to the substrate, the cage being outside of the normal operating range of motion of the proof mass;
   wherein the cage limits the motion of the proof mass in a direction parallel to the substrate when the DC voltage displaces the proof mass to a position toward the substrate that is beyond the normal operating range of motion of the proof mass.

14. The micromachined device of claim 13, wherein the cage limits the motion of the proof mass in any direction parallel to the substrate.

15. The micromachined device of claim 14, wherein the at least one island is mounted on or is a part of the cage.

16. A micromachined device comprising:

a proof mass flexibly coupled to a substrate, the proof mass having a normal operating range of motion;

at least one non-suspended structure mounted on the substrate; and a layer of insulating or semi-insulating material positioned between the proof mass and the substrate, the layer preventing electrical contact between the proof mass and the at least one non-suspended structure;

wherein a DC voltage applied between the proof mass and the at least one non-suspended structure displaces the proof mass to a position beyond the normal operating range of motion of the proof mass.

17. The micromachined device of claim 16, wherein the non-suspended structure comprises a sense plate.

18. The micromachined device of claim 16, wherein the insulating or semi-insulating layer is affixed to the non-suspended structure, and wherein;

the displacement of the proof mass due to the DC voltage causes the proof mass to maintain contact with the insulating or semi-insulating layer.

19. The micromachined device of claim 16, wherein the insulating or semi-insulating layer is affixed to the proof mass, and wherein;

the displacement of the proof mass due to the DC voltage causes the insulating or semi-insulating layer to contact the non-suspended structure.

20. The micromachined device of claim 16, further comprising:

a cage mounted on the substrate, the cage being beyond the normal operating range of motion of the proof mass;

wherein the cage limits the motion of the proof mass in a direction parallel to the substrate when the proof mass is moved toward the substrate beyond the normal operating range of motion by the DC voltage.

21. The micromachined device of claim 20, wherein the cage limits the motion of the proof mass in any direction parallel to the substrate.

* * * * *